United States Patent
Byun et al.

(10) Patent No.: US 11,844,241 B2
(45) Date of Patent: Dec. 12, 2023

(54) DISPLAY DEVICE HAVING A POWER SUPPLY ELECTRODE LAYER INCLUDING A PLURALITY OF HOLES

(71) Applicant: Samsung Display Co., Ltd., Yongin-si (KR)

(72) Inventors: Minwoo Byun, Yongin-si (KR); Keonwoo Kim, Yongin-si (KR); Mangi Kim, Yongin-si (KR); Donghyun Lee, Yongin-si (KR); Byeongguk Jeon, Yongin-si (KR); Byungsun Kim, Yongin-si (KR); Yangwan Kim, Yongin-si (KR); Hyungjun Park, Yongin-si (KR); Sujin Lee, Yongin-si (KR); Jaeyong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 171 days.

(21) Appl. No.: 17/307,292

(22) Filed: May 4, 2021

(65) Prior Publication Data
US 2021/0257424 A1   Aug. 19, 2021

Related U.S. Application Data

(63) Continuation of application No. 15/823,613, filed on Nov. 28, 2017, now Pat. No. 11,004,915.

(30) Foreign Application Priority Data

Jul. 3, 2017  (KR) ........................ 10-2017-0084408

(51) Int. Cl.
*H10K 59/122*   (2023.01)
*H10K 59/124*   (2023.01)
(Continued)

(52) U.S. Cl.
CPC ........ *H10K 59/122* (2023.02); *H10K 50/841* (2023.02); *H10K 50/844* (2023.02); *H10K 59/124* (2023.02); *H10K 59/131* (2023.02)

(58) Field of Classification Search
CPC ............ H01L 51/50–56; H01L 27/3241–3276
See application file for complete search history.

(56) References Cited

U.S. PATENT DOCUMENTS

| 7,528,544 B2 | 5/2009 | Kwak et al. |
| 9,000,428 B2 | 4/2015 | Lee et al. |

(Continued)

FOREIGN PATENT DOCUMENTS

| JP | 2003271075 A | * 9/2003 | ......... H01L 51/5246 |
| JP | 2016-048696 | 4/2016 | |

(Continued)

OTHER PUBLICATIONS

Machine Translation of JP 2003271075 A, published Sep. 25, 2003.*

(Continued)

*Primary Examiner* — Suberr L Chi
(74) *Attorney, Agent, or Firm* — H.C. Park & Associates, PLC

(57) ABSTRACT

A display device including: a substrate; a plurality of display elements defining a display area on the substrate and each including a pixel electrode, an opposite electrode, and an intermediate layer between the pixel electrode and the opposite electrode; a power supply wiring disposed outside the display area; an organic insulating layer on the power supply wiring and having an opening exposing the power supply wiring; a power supply electrode layer partially disposed on the organic insulating layer and including a plurality of holes over the organic insulating layer. A first portion of the power supply electrode layer overlaps the (Continued)

power supply wiring and a second portion of the power supply electrode layer overlaps the opposite electrode; a plurality of protrusions spaced apart from each other and respectively covering at least some of the plurality of holes; and an encapsulation layer covering the plurality of display elements.

19 Claims, 6 Drawing Sheets

(51) Int. Cl.
*H10K 59/131* (2023.01)
*H10K 50/84* (2023.01)
*H10K 50/844* (2023.01)

(56) References Cited

U.S. PATENT DOCUMENTS

| | | | |
|---|---|---|---|
| 9,035,330 B2 | 5/2015 | Kang et al. |
| 9,356,085 B2 | 5/2016 | Kim |
| 9,450,034 B2 | 9/2016 | Lee et al. |
| 2006/0060850 A1 | 3/2006 | Kwak et al. |
| 2013/0001612 A1 | 1/2013 | Lee et al. |
| 2015/0185942 A1 | 7/2015 | Kim et al. |
| 2017/0040398 A1 | 2/2017 | Kwak et al. |
| 2017/0278912 A1 | 9/2017 | Kim et al. |
| 2017/0287995 A1 | 10/2017 | Kim et al. |

FOREIGN PATENT DOCUMENTS

| | | |
|---|---|---|
| KR | 10-2005-0013874 | 2/2005 |
| KR | 10-2014-0133053 | 11/2014 |
| KR | 10-2015-0016784 | 2/2015 |
| KR | 10-2015-0037134 | 4/2015 |
| KR | 10-2015-0081728 | 7/2015 |
| KR | 10-2017-0115149 | 10/2017 |

OTHER PUBLICATIONS

Non-Final Office Action dated Dec. 2, 2019, in U.S. Appl. No. 15/823,613.
Final Office Action dated Apr. 15, 2020, in U.S. Appl. No. 15/823,613.
Advisory Action dated Jun. 30, 2020, in U.S. Appl. No. 15/823,613.
Non-Final Office Action dated Sep. 4, 2020, in U.S. Appl. No. 15/823,613.
Notice of Allowance dated Jan. 13, 2021, in U.S. Appl. No. 15/823,613.
Corrected Notice of Allowance dated Apr. 15, 2021, in U.S. Appl. No. 15/823,613.

* cited by examiner

DISPLAY DEVICE HAVING A POWER SUPPLY ELECTRODE LAYER INCLUDING A PLURALITY OF HOLES

CROSS-REFERENCE TO RELATED APPLICATION

This application is a Continuation of U.S. patent application Ser. No. 15/823,613, filed Nov. 28, 2017, which claims priority from and the benefit of Korean Patent Application No. 10-2017-0084408, filed on Jul. 3, 2017, which is hereby incorporated by reference for all purposes as if fully set forth herein.

BACKGROUND

Field

Exemplary embodiments relate to a display device.

Discussion of the Background

An organic light-emitting display device, i.e., a self-emission type display device, does not require a separate light source, may be driven at a low voltage, lightweight, and thin. Also, the organic light-emitting display device is receiving attention as a next-generation display device according to its high quality characteristics, such as a wide viewing angle, high contrast, and quick response speed.

An organic light-emitting diode of the organic light-emitting display device may be damaged by impurities, such as moisture, oxygen, or a gas generated during operation, and in this case, the lifespan and quality of the organic light-emitting display device may decrease.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a high quality display device.

Additional aspects will be set forth in the detailed description which follows, and, in part, will be apparent from the disclosure, or may be learned by practice of the inventive concept.

According to exemplary embodiments, a display device includes: a substrate; a plurality of display elements defining a display area on the substrate and each including a pixel electrode, an opposite electrode, and an intermediate layer between the pixel electrode and the opposite electrode; a power supply wiring disposed outside the display area; an organic insulating layer on the power supply wiring and having an opening exposing the power supply wiring; a power supply electrode layer partially disposed on the organic insulating layer and comprising a plurality of holes over the organic insulating layer, wherein a first portion of the power supply electrode layer overlaps the power supply wiring and a second portion of the power supply electrode layer overlaps the opposite electrode; a plurality of protrusions spaced apart from each other and respectively covering at least some of the plurality of holes; and an encapsulation layer covering the plurality of display elements.

According to one or more exemplary embodiments, a display device includes: a thin-film transistor (TFT) including a semiconductor layer and a gate electrode; an organic insulating layer covering the TFT; a plurality of display elements electrically connected to the TFT and each including a pixel electrode disposed on the organic insulating layer, an opposite electrode on the pixel electrode, and an intermediate layer between the pixel electrode and the opposite electrode; a power supply wiring partially surrounding the plurality of display elements; a power supply electrode layer disposed on the organic insulating layer, electrically connecting the power supply wiring and the opposite electrode, and including a plurality of holes therein; a plurality of protrusions spaced apart from each other on the power supply electrode layer; and an encapsulation layer covering the plurality of display elements and including at least one inorganic encapsulation layer and at least one organic encapsulation layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
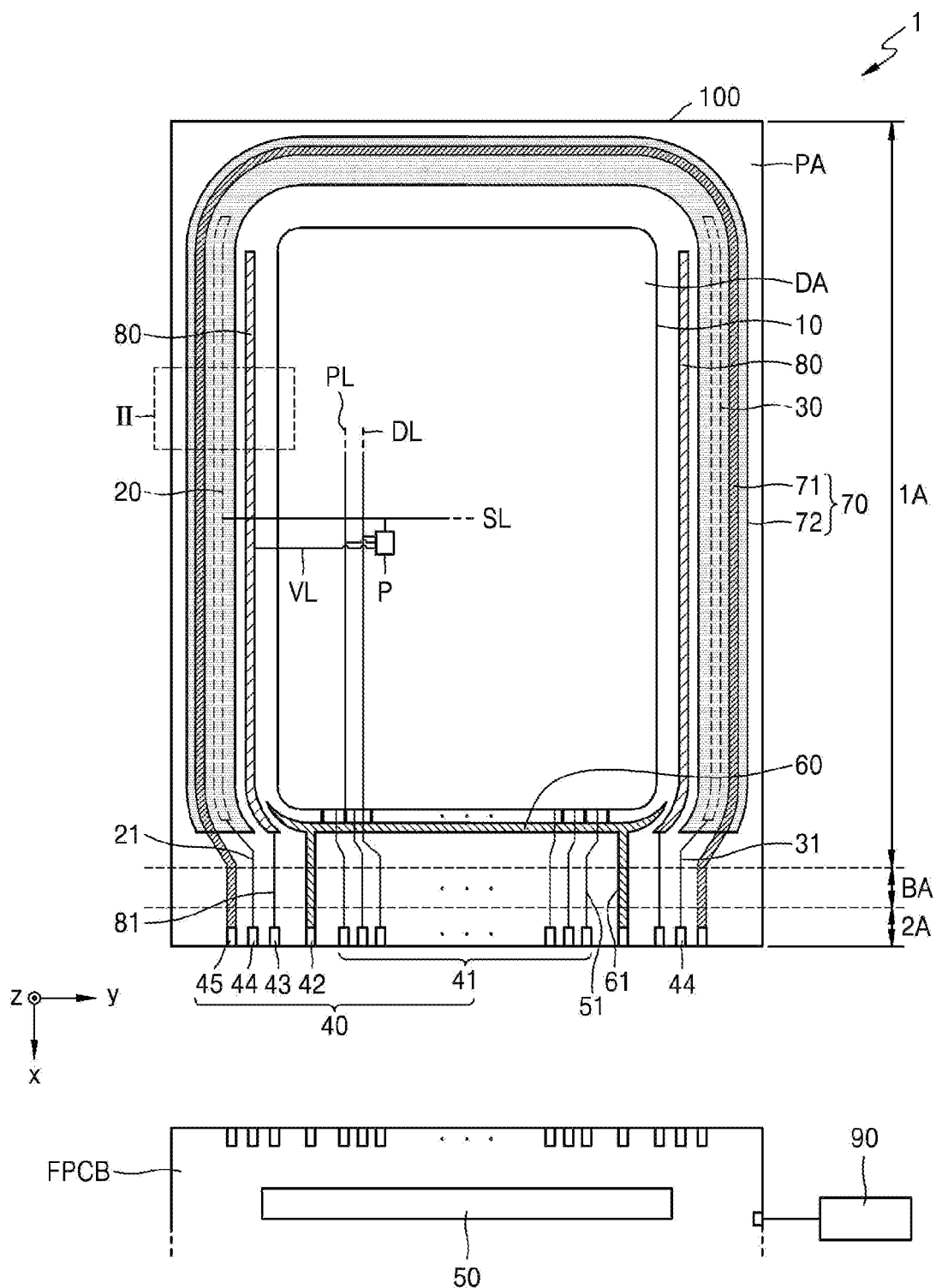
FIG. 1 is a plan view of a part of a display device, according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
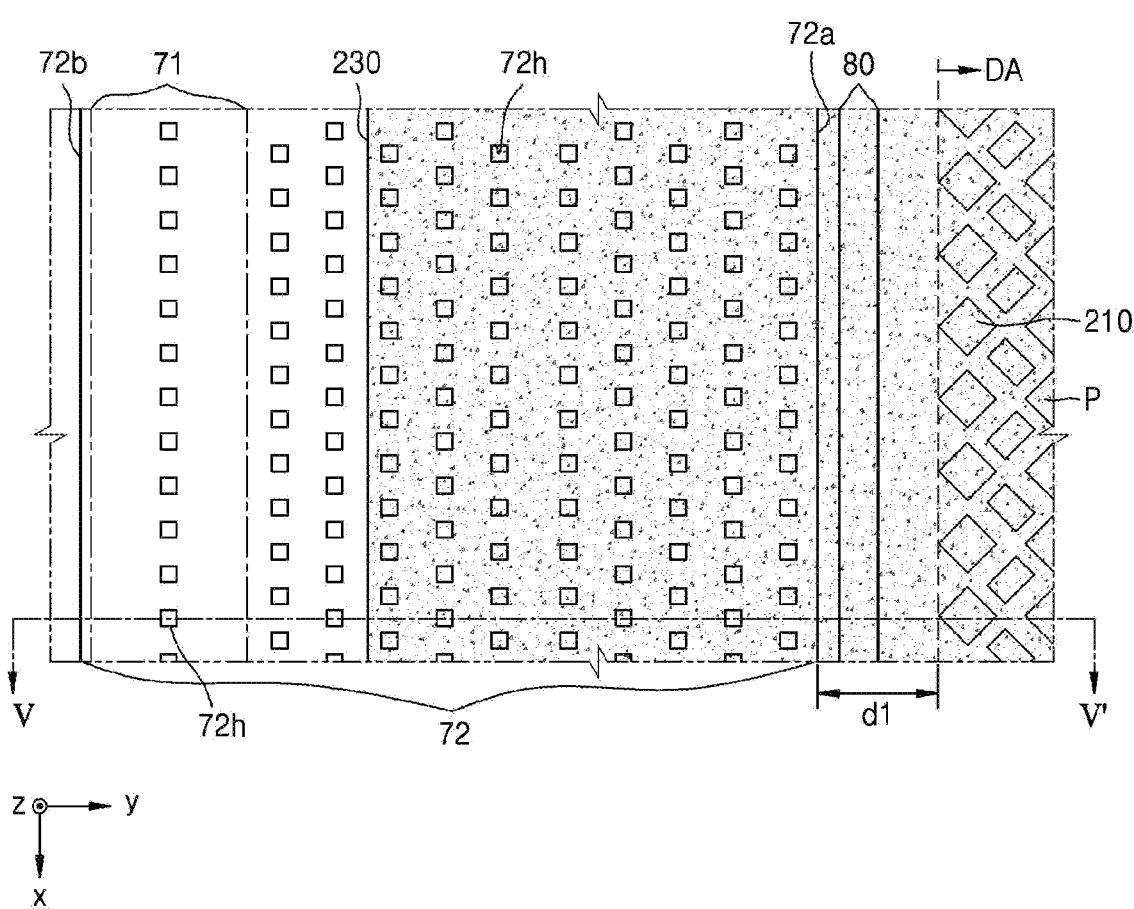
FIG. 2 is an excerpted plan view of a region II of FIG. 1.
Figure 3:
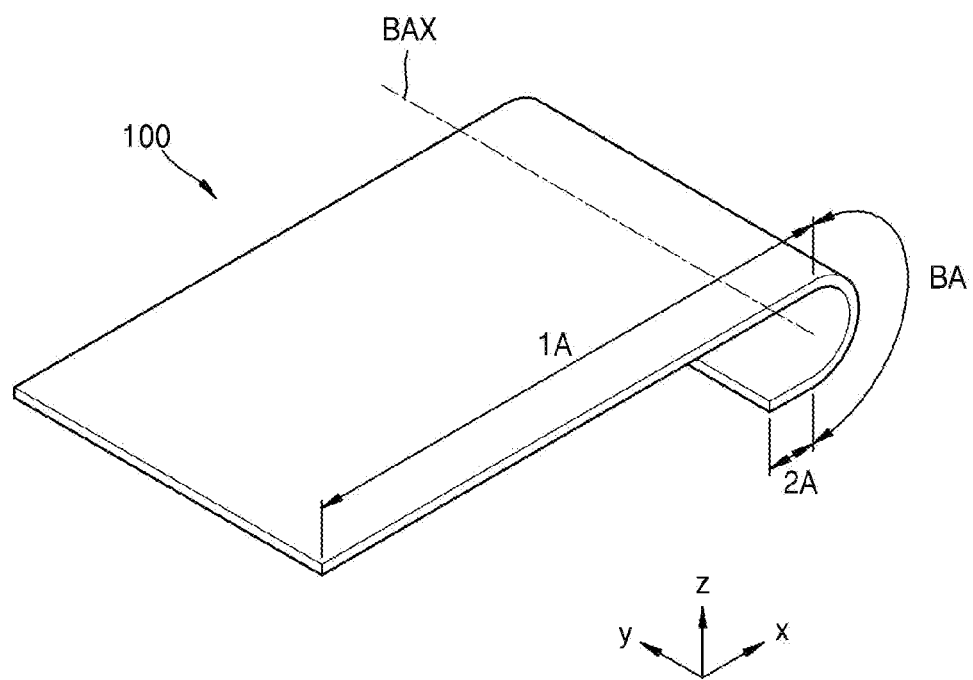
FIG. 3 is a perspective view of a part of a display device, according to an exemplary embodiment.

FIG. 1 is a plan view of a part of a display device 1, according to an embodiment, FIG. 2 is an excerpted plan view of a region II of FIG. 1, and FIG. 3 is a perspective view of a part of the display device 1, according to an exemplary embodiment.

Referring to FIG. 1, the display device 1 includes a display unit 10 provided on a substrate 100. The display unit 10 may include pixels P connected to a scan line SL extending in a y-direction and to a data line DL extending in an x-direction crossing the y-direction.

The pixels P may each emit a red, green, or blue light. Alternatively, the pixels P may each emit a red, green, blue, or white light. Each pixel P may include a display element, and the display element may include an organic light-emitting diode (OLED). The display unit 10 may provide an image through lights emitted from the pixels P, and define a display area DA. In the present specification, the pixel P denotes a sub-pixel emitting one of red, green, blue (or white) lights as described above.

A peripheral area PA may be provided outside the display area DA. For example, the periphery area PA may surround the display area DA. The pixels P may not be provided in the peripheral area PA, and thus the periphery area PA may not provide an image. First and second scan drivers 20 and 30, a terminal unit 40, a driving power supply line 60, and an electrode power supply line 70, may be provided in the peripheral area PA.

The first and second scan drivers 20 and 30 may be provided on the peripheral area PA of the substrate 100, and generate and provide a scan signal to each pixel P through the scan line SL. For example, the first scan driver 20 may be provided on the left of the display unit and the second scan driver 30 may be provided on the right of the display unit 10, but the present disclosure is not limited thereto. According to another exemplary embodiment, one scan driver may be provided on the left or right of the display unit 10.

The terminal unit 40 may be provided at one end portion of the substrate 100, and includes a plurality of terminals 41 through 45. The terminal unit 40 may not be covered by an insulating layer but may be exposed to be electrically connected to a flexible printed circuit board FPCB.

The flexible printed circuit board FPCB may electrically connect a controller 90 and the terminal unit 40, and a signal transmitted from the controller 90 may be transferred through wirings 21, 31, 51, 61, and 81, or power from the controller 90 may be transferred through power supply wiring 71.

The controller 90 may generate a control signal for controlling driving of the first and second scan drivers 20 and 30 upon receiving a vertical synchronization signal, a horizontal synchronization signal, and a clock signal. The generated control signal may be transmitted to the terminal 44 connected to the flexible printed circuit board FPCB, and each of the first and second scan drivers 20 and 30 respectively through the wirings 21 and 31, and the scan signal of the first or second scan driver 20 or 30 may be provided to each pixel P through the scan line SL. Also, the controller 90 may provide driving power ELVDD and common power ELVSS to the driving power supply line 60 and the electrode power supply line 70 through the terminals 42 and 45 connected to the flexible printed circuit board FPCB and through the wiring 61 and the power supply wiring 71, respectively. The driving power ELVDD may be provided to each pixel P through a driving voltage line PL and the common power ELVSS may be provided to an opposite electrode of the pixel P.

A data driver 50 may be provided at the flexible printed circuit board FPCB. The data driver 50 provides a data signal to each pixel P. The data signal of the data driver 50 may be provided to each pixel P through the terminal 41, the wiring 51 connected to the terminal 41, and the data line DL connected to the wiring 51. In FIG. 1, the data driver 50 is provided on the flexible printed circuit board FPCB, but the present disclosure is not limited thereto. According to another exemplary embodiment, the data driver 50 may be provided on the peripheral area PA of the substrate 100.

The driving power supply line 60 may be provided on the peripheral area PA. For example, the driving power supply line 60 may be provided between the terminal unit 40 and the display unit 10. The driving power ELVDD provided through the wiring 61 connected to the terminal 41 may be provided to each pixel P through the driving voltage line PL as described above.

The electrode power supply line 70 may be provided on the peripheral area PA and provide the common power ELVSS to the opposite electrode (for example, a cathode) of the OLED of the pixel P.

The electrode power supply line 70 may include the power supply wiring 71 connected to the terminal 45 and a power supply electrode layer 72 electrically connected to the power supply wiring 71. The power supply wiring 71 and the power supply electrode layer 72 may partially surround the display unit 10.

The power supply wiring 71 may partially surround the display unit 10 while being connected to the terminal 45 provided at one end portion of the substrate 100. For example, the power supply wiring 71 may have a loop form where one side adjacent to the terminal unit 40 is opened, and may extend along an edge of the substrate 100 where the terminal unit 40 is excluded.

The power supply electrode layer 72 may be provided on the peripheral area PA to partially surround the display unit 10. The power supply electrode layer 72 may have a loop form having one opened side, and may extend along the edge of the substrate 100 where the terminal unit 40 is excluded. For example, the power supply electrode layer 72 may extend along an edge excluding one side of the display unit 10 adjacent to the terminal unit 40. The power supply electrode layer 72 may be provided at one side of a bending area BA of the peripheral area PA, for example, on a first area 1A where the display unit 10 is located.

A part of the power supply electrode layer 72 may overlap the power supply wiring 71 and may be electrically connected to the power supply wiring 71. An overlapping portion of the power supply wiring 71 and the power supply electrode layer 72 may partially surround the display unit 10, excluding one side of the display unit 10 adjacent to the driving power supply line 60.

The power supply electrode layer 72 may have a larger width than that of the power supply wiring 71 and overlaps the power supply wiring 71. As shown in FIG. 2, a first edge 72a of the power supply electrode layer 72 may be adjacent to the display area DA and a second edge 72b opposite to the first edge 72a may be provided adjacent to the edge of the substrate 100.

The power supply electrode layer 72 may include a plurality of holes 72h. The plurality of holes 72h may provide a path for discharging a gas included in an organic insulating layer below the power supply electrode layer 72. When heat is applied to the organic insulating layer during manufacture of the display device 1, a material included in the organic insulating layer may be evaporated and externally discharged through the holes 72h. Accordingly, a phenomenon in which the gas generated in the organic insulating layer moves towards the pixel P and affects some pixels P provided at the edge of the display area DA, thereby causing the some pixels P to not emit light, and which occurs when there is no hole 72h, may be prevented. In FIG. 2, a shape of the hole 72h may be a rectangle having a width and height of about 12 μm, but is not limited thereto. A size and shape of the hole 72h may vary.

A portion (hereinafter, referred to as a first portion) of the power supply electrode layer 72 may overlap the power supply wiring 71, and another portion (hereinafter, referred to as a second portion) of the power supply electrode layer 72 may overlap an opposite electrode 230 of the display element.

The power supply electrode layer 72 may electrically connect the power supply wiring 71 and the opposite electrode 230 of the display element. For example, at least a part of the first portion of the power supply electrode layer 72 may directly contact the power supply wiring 71, and at least a part of the second portion may directly contact the opposite electrode 230 of the display element to connect the power supply wiring 71 and the opposite electrode 230 of the display element.

The power supply electrode layer 72 may be spaced apart from the display area DA by a first distance dl. In order to effectively prevent the gas externally discharged through the hole 72h from moving to the display area DA, the first distance dl may be equal to or greater than about 85 μm. For example, the first edge 72a of the power supply electrode layer 72 may be spaced apart from a pixel electrode 210 of the pixel P provided outermost of the display area DA, by about 85 μm to 100 μm.

An initialization voltage wire 80 may be provided inside of the power supply electrode layer 72. The initialization voltage wire 80 may receive a certain voltage through the terminal 43 as shown in FIG. 1, and an initialization voltage may be provided to each pixel P through an initialization voltage line VL. The initialization voltage wire 80 may be provided on two sides of the display unit 10. For example, the initialization voltage wire 80 may be provided between a first side of the display unit 10 and the power supply electrode layer 72 and between a second side of the display unit 10 and the power supply electrode layer 72.

The peripheral area PA may include the bending area BA. The bending area BA may be provided between the terminal unit 40 and the display unit 10. The bending area BA may extend along a direction crossing an extending direction of the wirings 21, 31, 51, 61, 81, and the power supply wiring 71. For example, the bending area BA may have a certain width along an x-direction and extend along a y-direction, and the bending area BA may divide substrate 100 into the first area 1A including the display area DA and a second area 2A opposite to the first area 1A. In other words, the bending area BA is provided between the first and second areas 1A and 2A. The first area 1A may include the display area DA and a part of the peripheral area PA, and the second area 2A may include only a part of the peripheral area PA.

The display device 1 may be bent (curved) around the bending area BA. As shown in FIG. 3, a part of the substrate 100 of the display device 1 may be bent. For example, the substrate 100 may be bent around a bending axis BAX extending along the y-direction, and accordingly, the display device 1 may also have a bent shape like the substrate 100. Such a substrate 100 may include any one of various materials (for example, polymer resin) having a flexible or bendable characteristic. For convenience of illustration, FIG. 2 shows a bent structure of the substrate 100 instead of the display device 1.

Figure 4:
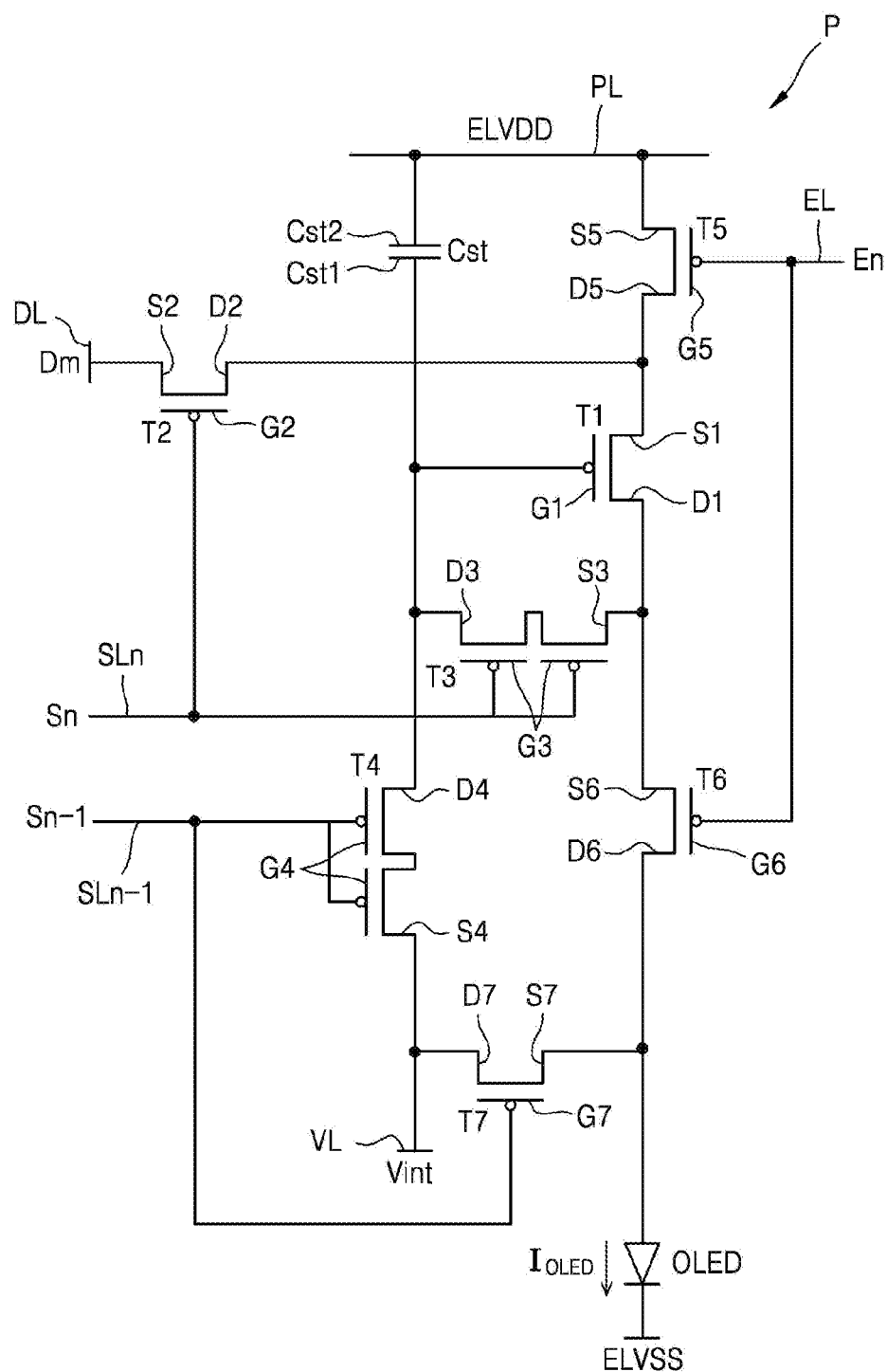
FIG. 4 is an equivalent circuit diagram of one pixel of a display device, according to an exemplary embodiment.

FIG. 4 is an equivalent circuit diagram of one pixel P of a display device, according to an exemplary embodiment.

Referring to FIG. 4, the pixel P includes signal lines, a plurality of thin-film transistors (TFT) connected to the signal lines, a storage capacitor Cst, the initialization voltage line VL, the driving voltage line PL and an organic light-emitting device OLED.

In FIG. 4, one pixel P may include the signal lines, the initialization voltage line VL, and the driving voltage, but the present disclosure is not limited thereto. According to another exemplary embodiment, at least one of the signal lines and/or the initialization voltage line VL may be shared between neighboring pixels P.

The plurality of TFTs may include a driving TFT T1, a switching TFT T2, a compensation TFT T3, a first initialization TFT T4, an operation control TFT T5, an emission control TFT T6, and a second initialization TFT T7.

The signal lines may include a scan line SLn transmitting a scan signal Sn, a previous scan line SLn−1 transmitting a previous scan signal Sn−1 to the first and second initialization TFTs T4 and T7, an emission control line EL transmitting an emission control signal En to the operation control TFT T5 and the emission control TFT T6, and the data line DL transmitting a data signal Dm and crossing the scan line SLn.

The driving voltage line PL may transmit the driving power ELVDD to the driving TFT T1, and the initialization voltage line VL may transmit an initialization voltage Vint initializing the driving TFT T1 and a pixel electrode.

A driving gate electrode G1 of the driving TFT T1 may be connected to a first storage capacitor plate Cst1 of the storage capacitor Cst, a driving source electrode S1 of the driving TFT T1 may be connected to the driving voltage line PL through the operation control TFT T5, and the driving drain electrode D1 of the driving TFT T1 may be electrically connected to the pixel electrode of the organic light-emitting device OLED through the emission control TFT T6. The driving TFT T1 may supply a driving current $I_{OLED}$ to the organic light-emitting device OLED upon receiving the data signal Dm according to a switching operation of the switching TFT T2.

A switching gate electrode G2 of the switching TFT T2 may be connected to the scan line SLn, a switching source electrode S2 of the switching TFT T2 may be connected to the data line DL, and a switching drain electrode D2 of the switching TFT T2 may be connected to the driving source electrode S1 of the driving TFT1 and connected to the driving voltage line PL via the operation control TFT T5. The switching TFT T2 may be turned on according to the scan signal Sn received through the scan line SLn and perform a switching operation of transmitting the data signal Dm received from the data line DL to the driving source electrode S1 of the driving TFT T1.

A compensation gate electrode G3 of the compensation TFT T3 may be connected to the scan line SLn, a compensation source electrode S3 of the compensation TFT T3 may be connected to the driving drain electrode D1 of the driving TFT T1 and connected to the pixel electrode of the organic light-emitting device OLED via the emission control TFT T6, and a compensation drain electrode D3 of the compensation TFT T3 may be connected to the first storage capacitor plate Cst1 of the storage capacitor Cst, a first initialization drain electrode D4 of the first initialization TFT T4, and the driving gate electrode G1 of the driving TFT T1. The compensation TFT T3 may be turned on according to the scan signal Sn received through the scan line SLn, and electrically connects the driving gate electrode G1 and the driving drain electrode D1 of the driving TFT T1 to diode-connect the driving TFT T1.

A first initialization gate electrode G4 of the first initialization TFT T4 may be connected to the previous scan line SLn−1, a first initialization source electrode S4 of the first initialization TFT T4 may be connected to a second initialization drain electrode D7 of the second initialization TFT T7 and the initialization voltage line VL, and the first initialization drain electrode D4 of the first initialization TFT T4 may be connected to the first storage capacitor plate Cst1 of the storage capacitor Cst, the compensation drain electrode D3 of the compensation TFT T3, and the driving gate electrode G1 of the driving TFT T1. The first initialization TFT T4 may be turned on according to the previous scan signal Sn−1 received through the previous scan line SLn−1, and transmits the initialization voltage Vint to the driving gate electrode G1 of the driving TFT T1 to perform an initialization operation of initializing a voltage of the driving gate electrode G1 of the driving TFT T1.

An operation control gate electrode G5 of the operation control TFT T5 may be connected to the emission control line EL, an operation control source electrode S5 of the operation control TFT T5 may be connected to the driving voltage line PL, and an operation control drain electrode D5 of the operation control TFT T5 may be connected to the driving source electrode S1 of the driving TFT T1 and the switching drain electrode D2 of the switching TFT T2.

An emission control gate electrode G6 of the emission control TFT T6 may be connected to the emission control line EL, an emission control source electrode S6 of the emission control TFT T6 may be connected to the driving drain electrode D1 of the driving TFT T1 and the compensation source electrode S3 of the compensation TFT T3, and an emission control drain electrode D6 of the emission control TFT T6 may be electrically connected to a second initialization source electrode S7 of the second initialization TFT T7 and the pixel electrode of the organic light-emitting device OLED.

The operation control TFT T5 and the emission control TFT T6 may be simultaneously turned on according to the emission control signal En received through the emission control line EL, and thus the driving power ELVDD may be transmitted to the organic light-emitting device OLED such that the driving current $I_{OLED}$ flows through the organic light-emitting device OLED.

A second initialization gate electrode G7 of the second initialization TFT T7 may be connected to the previous scan line SLn−1, the second initialization source electrode S7 of the second initialization TFT T7 may be connected to the emission control drain electrode D6 of the emission control TFT T6 and the pixel electrode of the organic light-emitting device OLED, and the second initialization drain electrode D7 of the second initialization TFT T7 may be connected to the first initialization source electrode S4 of the first initialization TFT T4 and the initialization voltage line VL. The second initialization TFT T7 may be turned on according to the previous scan signal Sn−1 received through the previous scan line SLn−1 to initialize the pixel electrode of the organic light-emitting device OLED.

In FIG. 4, the first and second initialization TFTs T4 and T7 are connected to the previous scan line SLn−1, but the present disclosure is not limited thereto. According to another exemplary embodiment, the first initialization TFT T4 may be connected to the previous scan line SLn−1 and driven according to the previous scan signal Sn−1, and the second initialization TFT T7 may be connected to a separate signal line (for example, a subsequent scan line) and driven according to a signal received from the separate signal line.

A second storage capacitor plate Cst2 of the storage capacitor Cst may be connected to the driving voltage line PL and the opposite electrode of the organic light-emitting device OLED is connected to the common power ELVSS. Accordingly, the organic light-emitting device OLED may display image by emitting light upon receiving the driving current $I_{OLED}$ from the driving TFT T1.

In FIG. 4, the compensation TFT T3 and the first initialization TFT T4 include a dual gate electrode, but the present disclosure is not limited thereto. For example, the compensation TFT T3 and the first initialization TFT T4 may include one gate electrode. Alternatively, at least one of the driving TFT T1, the switching TFT T2, the operation control TFT T5, the emission control TFT T6, and the second initialization TFT T7, but not the compensation TFT T3 or the first initialization TFT T4, may include a dual gate electrode.

Figure 5:
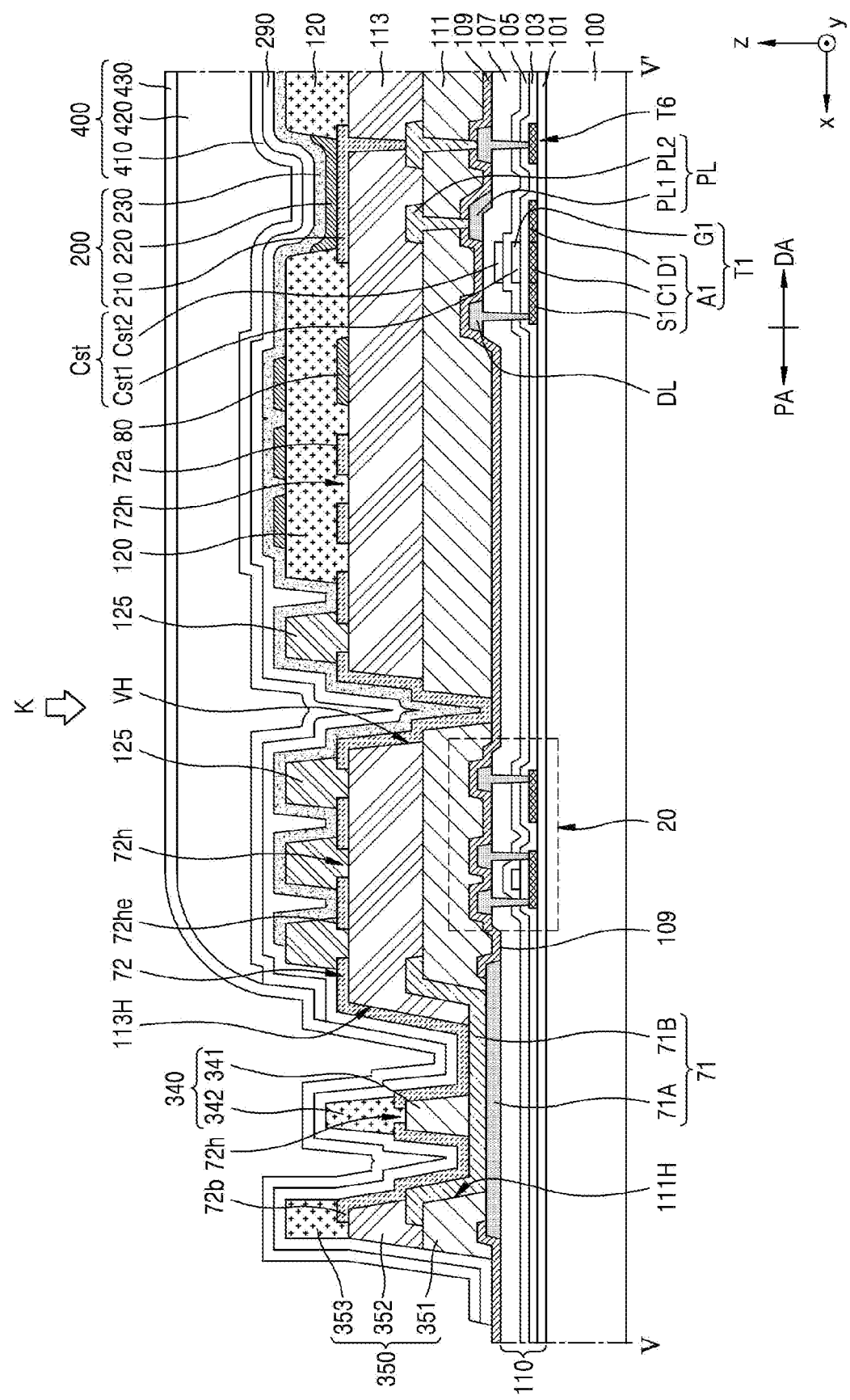
FIG. 5 is a cross-sectional view of a part of a display device, according to an exemplary embodiment.

FIG. 5 is a cross-sectional view of a part of a display device, according to an exemplary embodiment, and FIG. 7 is a plan view of a part of a display device, according to an exemplary embodiment. FIG. 5 may correspond to a cross-sectional view taken along a line V-V of FIG. 2, and FIG. 6 may correspond to a plan view of FIG. 5 viewed in a direction indicated by an arrow K.

The display area DA will be described first with reference to FIGS. 5 and 6, and then the peripheral area PA will be described.

Figure 6:
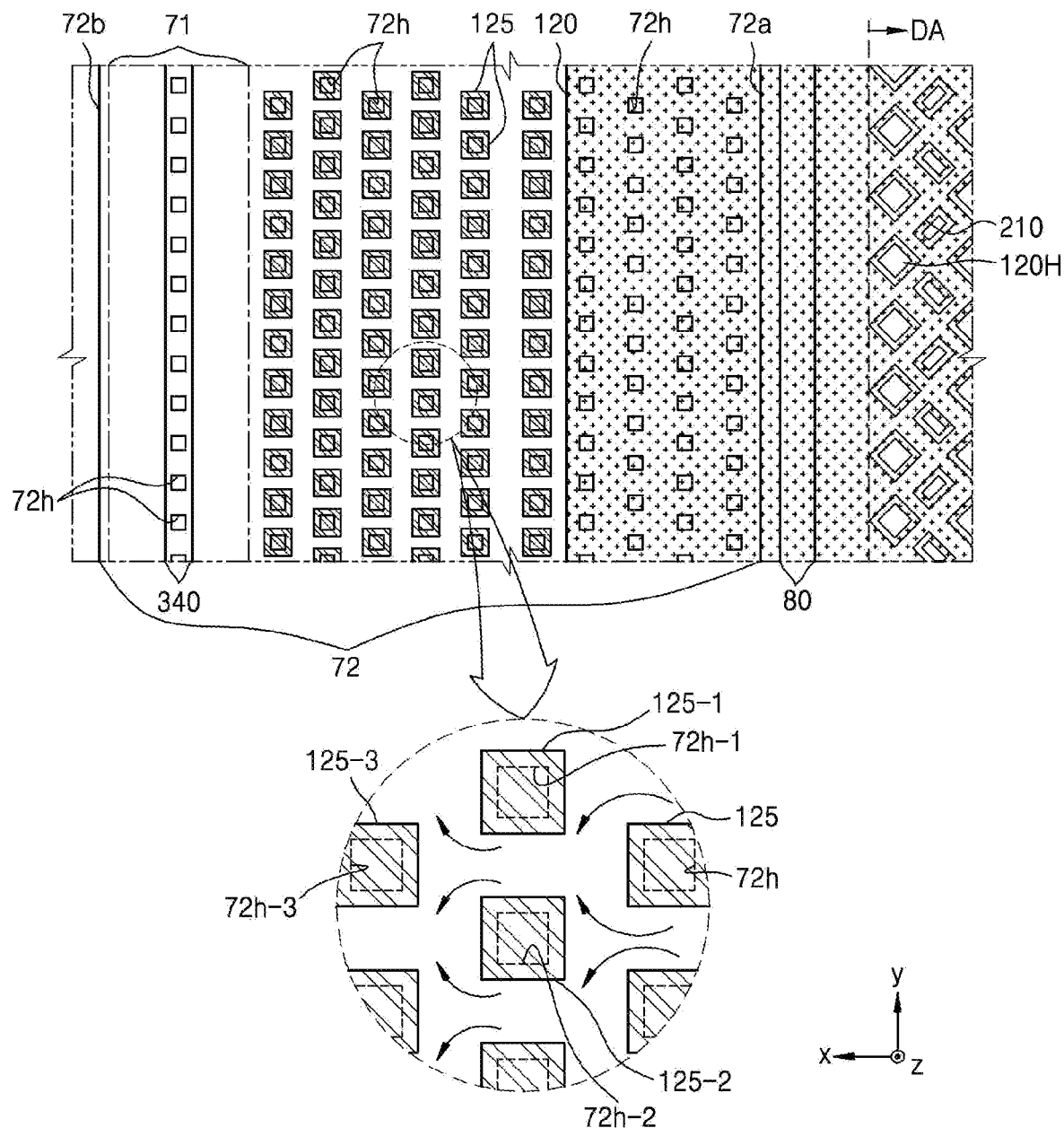
FIG. 6 is a plan view of a part of a display device, according to an exemplary embodiment.

Referring to FIG. 6, a buffer layer 101 may be formed on the substrate 100. The substrate 100 may include plastic, such as polyethylene terephthalate (PET), polyethylene naphthalate (PEN), or polyimide. Although not illustrated, the substrate 100 may include a multilayer including a barrier layer formed of an inorganic material between plastic layers including polyimide.

The buffer layer 101 may block impurities or moisture penetrating through the substrate 100. For example, the buffer layer 101 may include an inorganic material, such as silicon oxide (SiOx), silicon nitride (SiNx), and/or silicon oxynitride (SiON), and may be formed of a single layer or a multilayer.

TFTs and the storage capacitor Cst, which are provided at locations corresponding to the display area DA, and an OLED 200 that is a display element electrically connected to the TFTs and the storage capacitor Cst, may be provided over the substrate 100. In FIG. 5, the driving TFT T1 and the emission control TFT T6 from among the TFTs described above with reference to FIG. 4 are illustrated.

The driving TFT T1 may include a driving semiconductor layer A1 and the driving gate electrode G1. The driving semiconductor layer A1 may include, for example, polysilicon. The driving semiconductor layer A1 may include a driving channel region C1 overlapping the driving gate electrode G1, and a driving source region S1 and a driving drain region D1 respectively provided on two sides of the driving channel region C1 and including impurities of higher concentration that those of the driving channel region C1. Here, the impurities may include N-type or P-type impurities. The driving source region S1 and the driving drain region D1 may respectively correspond to the driving source electrode and the driving drain electrode of the driving TFT T1 of FIG. 4.

A gate insulating layer 103 may be provided between the driving semiconductor layer A1 and the driving gate electrode G1 to insulate them. The gate insulating layer 103 may be an inorganic material layer including SiON, SiOx, and/or SiNx, wherein the inorganic material layer may be a single layer or a multilayer.

The storage capacitor Cst may include the first and second storage capacitor plates Cst1 and Cst2 that overlap each other. A first interlayer insulating layer 105 may be provided between the first and second storage capacitor plates Cst1 and Cst2, wherein the first interlayer insulating layer 105 may have a certain dielectric constant, may be an inorganic material layer including SiON, SiOx, and/or SiNx, and may be a single layer or multiple layers. In FIG. 5, the first storage capacitor plate Cst1 may be the driving gate electrode G1 of the driving TFT T1, but the present disclosure is not limited thereto. The storage capacitor Cst may be covered by a second interlayer insulating layer 107. The second interlayer insulating layer 107 may be an inorganic material layer including SiON, SiOx, and/or SiNx, and may be a single layer or multiple layers.

The driving voltage line PL may include a first driving voltage line PL1 and a second driving voltage line PL2. The first driving voltage line PL1 may include the same material as the data line DL. For example, the first driving voltage line PL1 and the data line DL may include aluminum (Al), copper (Cu), and titanium (Ti), and may include a single layer or a multilayer. According to an exemplary embodiment, the first driving voltage line PL1 and the data line DL may have a multilayer structure of Ti/Al/Ti.

The second driving voltage line PL2 may be provided over the first driving voltage line PL1, wherein a first organic insulating layer 111 is provided therebetween, and the second driving voltage line PL2 may be electrically connected to the first driving voltage line PL1 through a contact hole defined in the first organic insulating layer 111. The second driving voltage line PL2 may include Al, Cu, or Ti, and may be a single layer or a multilayer. According to an exemplary embodiment, the second driving voltage line PL2 may have a multilayer structure of Ti/Al/Ti. The first organic insulating layer 111 may include an organic insulating material, and examples of the organic insulating material include imide-based polymers, general-purpose polymers, such as polymethylmethacrylate (PMMA) and polystylene (PS), polymer derivatives having a phenol-based group, acryl-based polymers, arylether-based polymers, amide-based polymers, fluoride-based polymers, p-xylen-based polymers, vinyl alcohol-based polymers, and blends thereof. According to an exemplary embodiment, the first organic insulating layer 111 may include polyimide.

The driving voltage line PL may supply a uniform electric signal, i.e., the driving power ELVDD which is a constant voltage, to a plurality of pixels. In order to furnish a display device providing a high quality image, a voltage drop needs to be prevented from occurring in the driving voltage line PL. According to one or more exemplary embodiments, since the driving voltage line PL includes the first and second driving voltage lines PL1 and PL2 that are electrically connected to reduce self-resistance, a voltage drop caused by resistance of the driving voltage line PL may be prevented or reduced even when an area of the pixel is reduced to realize a high resolution display device. The driving voltage line PL may be covered by a second organic insulating layer 113, and the second organic insulating layer 113 may include an imide-based polymer, a general-purpose polymer, such as PMMA or PS, a polymer derivative having a phenol-based group, an acryl-based polymer, an arylether-based polymer, an amide-based polymer, a fluoride-based polymer, a p-xylen-based polymer, a vinyl alcohol-based polymer, or a blend thereof. According to an exemplary embodiment, the second organic insulating layer 113 may include polyimide.

The pixel electrode 210 may be provided on the second organic insulating layer 113. In FIG. 5, the pixel electrode 210 is electrically connected to the emission control TFT T6.

A pixel-defining layer 120 may be provided on the pixel electrode 210, and may have an opening corresponding to each sub-pixel, i.e., an opening 120H exposing at least center region of the pixel electrode 210 to define a pixel. Also, the pixel-defining layer 120 may increase a distance between an edge of the pixel electrode 210 and the opposite electrode 230, thereby preventing an arc from being generated therebetween. The pixel-defining layer 120 may be formed of an organic material, such as polyimide or hexamethyldisiloxane (HMDSO).

An intermediate layer 220 may include a low molecular weight or polymer material. When the intermediate layer 220 includes a low molecular weight material, the intermediate layer 220 may have a structure in which a hole injection layer (HIL), a hole transport layer (HTL), an emission layer (EML), an electron transport layer (ETL), and an electron injection layer (EIL) are stacked on each other in a single-layer or multi-layer structure. The intermediate layer 220 may include any one of various organic materials, such as copper phthalocyanine (CuPc), N,N'-di(naphthalene-1-yl)-N,N'-diphenyl-benzidine (NPB), and tris-8-hydroxyquinoline aluminum (Alq3). The intermediate layer 220 may be formed via a vacuum deposition method.

When the intermediate layer 220 includes a polymer material, the intermediate layer 220 may mostly include an HTL and an EML. Here, the HTL may include PEDOT, and the EML may include a poly-phenylenevinylene (PPV)-based polymer material or a polyfluorene-based polymer material. However, a structure of the intermediate layer 220 is not limited thereto. For example, the intermediate layer 220 may be integrally formed throughout a plurality of the pixel electrodes 210. The intermediate layer 220 may include a layer patterned to correspond to each of the plurality of pixel electrodes 210.

The opposite electrode 230 may be provided over the display area DA and may be provided to cover the display area DA. In other words, the opposite electrode 230 may be integrally formed to cover the plurality of pixels.

An encapsulation layer 400 may cover the OLED 200, and may prevent the OLED 200 from being damaged by external moisture or oxygen. The encapsulation layer 400 may cover the display area DA and extend up to an outer region of the display area DA. Such an encapsulation layer 400 may include at least one inorganic encapsulation layer and at least one organic encapsulation layer. In FIG. 5, the encapsulation layer 400 may include a first inorganic encapsulation layer 410, an organic encapsulation layer 420, and a second inorganic encapsulation layer 430.

The first inorganic encapsulation layer 410 may cover the opposite electrode 230 and may include SiOx, SiNx, and/or SiON. If required, a plurality of layers including a capping layer 290 may be provided between the first inorganic encapsulation layer 410 and the opposite electrode 230. Since the first inorganic encapsulation layer 410 may be formed above another structure below, a top surface of the first inorganic encapsulation layer 410 may not be flat. The organic encapsulation layer 420 may cover a first inorganic encapsulation layer 410, and unlike the first inorganic encapsulation layer 410, a top surface of the organic encapsulation layer 420 may be substantially flat. For example, the top surface of the organic encapsulation layer 420 may be substantially flat at a region corresponding to the display area DA. The organic encapsulation layer 420 may include one or more materials selected from PET, PEN, polycarbonate, polyimide, polyethylene sulfonate, polyoxymethylene, polyarylate, and HMDSO. The second inorganic encapsulation layer 430 may cover the organic encapsulation layer 420, and may include SiOx, SiNx, and/or SiON.

Referring to the peripheral area PA of FIG. 5, an inorganic insulating layer 110 is provided on the substrate 100, wherein the inorganic insulating layer 110 may include the buffer layer 101, the gate insulating layer 103, and the first and second interlayer insulating layers 105 and 107 described above. The power supply wiring 71 may be provided on the inorganic insulating layer 110.

The power supply wiring 71 may include a first power supply wiring layer 71A and a second power supply wiring layer 71B. The first power supply wiring layer 71A may include the same material as the data line DL and the first driving voltage line PL1 described above, and the second power supply wiring layer 71B may include the same material as the second driving voltage line PL2.

The first power supply wiring layer 71A may be externally exposed by a first opening 111H of the first organic insulating layer 111 provided on the first power supply wiring layer 71A. A top surface of the first power supply wiring layer 71A exposed through the first opening 111H may directly contact the second power supply wiring layer 71B provided on the first organic insulating layer 111. The second power supply wiring layer 71B may directly contact the first power supply wiring layer 71A through the first opening 111H. Since the first and second power supply wiring layers 71A and 71B are electrically connected to each other, an area of the peripheral area PA may be reduced without a resistance increase of the power supply wiring 71.

A side surface of the first power supply wiring layer 71A may be covered by a protection layer 109. The protection layer 109 may prevent the first power supply wiring layer 71A including a metal, such as Al, that may be damaged by an etchant during a manufacturing process of the display device, from being exposed to an etching environment. The first power supply wiring layer 71A may be exposed without being covered by the first organic insulating layer 111 on the peripheral area PA that is not illustrated in FIG. 5, and the exposed first power supply wiring layer 71A may be damaged in a side surface thereof by the etchant used during a process performed after the first power supply wiring layer 71A is formed. In this regard, the protection layer 109 may cover and protect the side surface of the first power supply wiring layer 71A.

The protection layer 109 may cover TFTs (for example, the driving TFT T1 and the emission control TFT T6) in the display area DA. The protection layer 109 may include, for example, SiNx. In an exemplary embodiment, a hydrogen (ion) of the protection layer 109 may increase characteristics of the TFTs by combining with a dangling bond of a semiconductor layer of the TFT to remove a defect site in the semiconductor layer, but the present disclosure is not limited thereto.

The power supply wiring 71 may be covered by the second organic insulating layer 113, and may be externally exposed through a second opening 113H of the second organic insulating layer 113. In FIG. 5, the top surface of the power supply wiring 71 provided on two sides of a first dam 340 around the first dam 340 is exposed. The exposed top surface of the power supply wiring 71 may contact and be electrically connected to the power supply electrode layer 72.

The power supply electrode layer 72 may be provided on the second organic insulating layer 113, and may directly contact the top surface of the power supply wiring 71 through the second opening 113H. The power supply electrode layer 72 may include the plurality of holes 72h. For example, a region of the power supply electrode layer 72 overlapping the second organic insulating layer 113 may include the plurality of holes 72h, and a region of the power supply electrode layer 72 directly contacting the power supply wiring 71 may not include the hole 72h to increase a contact area between the power supply wiring 71 and the power supply electrode layer 72.

The holes 72h of the power supply electrode layer 72 may provide a passage for materials included in an insulating layer below the power supply electrode layer 72 to be evaporated and externally discharged. A thermal process (for example, a curing process) may be performed after the pixel-defining layer 120 is formed on the pixel electrode 210, and some of materials included in the first or second organic insulating layer 111 or 113 below the power supply electrode layer 72 may be evaporated by heat applied during the terminal process and externally discharged through the holes 72h. Accordingly, a phenomenon, in which a gas generated in an organic insulating layer moves towards the pixel and affects the OLED 200 of some pixels provided at the edge of the display area DA, thereby causing the OLED 200 to not emit light, which occurs when there is no hole 72h, may be prevented. The power supply electrode layer 72 may be formed of the same material as the pixel electrode 210. For example, the power supply electrode layer 72 may include three layers consisting of indium tin oxide (ITO), Ag, and ITO.

An edge of the power supply electrode layer 72 may be covered by an insulating layer. For example, the first edge 72a of the power supply electrode layer 72 facing the display area DA, and the second edge 72b opposite to the first edge 72a and facing an edge of the substrate 100, may each be covered by an insulating layer. In FIG. 5, the first and second edges 72a and 72b of the power supply electrode layer 72 are covered by an insulating layer including the same material as the pixel-defining layer 120.

An inner edge of the power supply electrode layer 72, i.e., a hole edge 72he surrounding the hole 72h, may also be covered by an insulating layer. As shown in FIGS. 5 and 6, some of the holes 72h of the power supply electrode layer 72 may be covered by the pixel-defining layer 120 extending to the peripheral area PA, and the remaining holes 72h may each be covered by a protrusion 125. The protrusion 125 may include an insulating material. For example, the protrusion 125 may include the same material as the pixel-defining layer 120 and may be formed during the same mask process as the pixel-defining layer 120.

As shown in FIG. 6, the protrusions 125 have island shapes and are spaced apart from each other. The protrusions 125 may have a larger size than corresponding holes 72h, and as shown in FIG. 5, may cover the hole edges 72he surrounding the corresponding holes 72h.

As the first and second edges 72a and 72b of the power supply electrode layer 72, and the hole edge 72he surrounding the hole 72h are all covered by an insulating material, a phenomenon in which some of materials forming the power supply electrode layer 72, for example, silver (Ag), are precipitated as silver by receiving electrons during a manufacturing process of the display device may be prevented. Accordingly, a phenomenon in which Ag is precipitated during the manufacturing process when the first and second edges 72a and 72b of the power supply electrode layer 72 and the hole edge 72he surrounding the hole 72h are exposed, and the precipitated Ag generating a blind spot may be prevented.

The holes 72h may be offset from each other and or may be provided in a zigzag manner. For example, as shown in an enlarged view of FIG. 6, the holes 72h may include first and second holes 72h-1 and 72h-2 spaced apart from each other along a first direction (or a y-direction parallel to the display area DA), and a third hole 72h-3 spaced apart from the first and second holes 72h-1 and 72h-2 along a second direction (or an x-direction facing an edge of the substrate 100 from the display area DA) crossing the first direction and provided between the first and second holes 72h-1 and 72h-2.

According to an arrangement of the holes 72h, the protrusions 125 overlapping the holes 72h may also be offset. For example, as shown in the enlarged view of FIG. 6, the protrusions 125 may include first and second protrusions 125-1 and 125-2 spaced apart from each other along the first direction, and a third protrusion 125-3 spaced apart from the first and second protrusions 125-1 and 125-2 along the second direction and provided between the first and second protrusions 125-1 and 125-2.

The protrusions 125 may control a flow of the organic encapsulation layer 420 of the encapsulation layer 400 described above. While forming the organic encapsulation layer 420, an organic material forming the organic encapsulation layer 420 flows toward the edge of the substrate 100, i.e., along the x-direction. Here, as shown in FIG. 6, the protrusions 125 provided in a zigzag manner interrupt a flow of the organic material, and thus may control a location of an end portion of the organic material in the display device, i.e., a location of the end portion of the organic encapsulation layer 420.

The organic encapsulation layer 420 that is formed while the flow of the organic material is controlled by the protrusions 125 may cover at least some of the protrusions 125. For example, the end portion of the organic encapsulation layer 420 may be provided on some of the protrusions 125 as shown in FIG. 5. The location of the end portion of the organic encapsulation layer 420 may be different from that of FIG. 5 based on a type of the organic material, or an arrangement or density of the protrusions 125. According to another exemplary embodiment, the end portion of the organic encapsulation layer 420 may be provided to correspond to an inner wall of the first dam 340 described below. The density of the protrusions 125 may depend on a density of the holes 72h. An area of the hole 72h per unit area (1 μm2) may be in a range from about 0.07 μm2 to about 0.19 μm2, for example, about 0.14 μm2. When the density of the holes 72h exceeds the range, a gas may be smoothly discharged through the holes 72h, but resistance of the power supply electrode layer 72 may increase.

The first dam 340 and a second dam 350 may be further provided outside the protrusions 125, i.e., at the edge of the substrate 100. The first and second dams 340 and 350 may prevent the organic material from entering the edge of the substrate 100 while forming the organic encapsulation layer 420 described above, thereby preventing an edge tail of the organic encapsulation layer 420 from being formed. In FIGS. 5 and 6, the first dam 340 may be provided on the power supply wiring 71, and the second dam 350 may be provided closer to the outside than the first dam 340.

As shown in FIG. 5, the first dam 340 may include a first layer 341 and a second layer 342. The first layer 341 may include the same material as the second organic insulating layer 113, and the second layer 342 may include the same material as the pixel-defining layer 120. The second dam 350 may include a first layer 351 including the same material as the first organic insulating layer 111, a second layer 352 including the same material as the second organic insulating layer 113, and a third layer 353 including the same material as the pixel-defining layer 120. In FIG. 5, the first and second dams 340 and 350 may respectively include two layers and three layers, but the current disclosure is not limited thereto.

The first and second dams 340 and 350 may be provided to entirely surround the display area DA in order to prevent an edge tail of the organic encapsulation layer 420. Accordingly, unlike the protrusions 125, the first and second dams 340 and 350 may have a continuous ring shape surrounding the display area DA, and the holes 72h of the power supply electrode layer 72 overlapping the first dam 340 may not be covered by the protrusions 125 spaced apart from each other, but may be covered by the continuous second layer 342 of the first dam 340.

Referring to FIG. 5, a part of the power supply electrode layer 72 may contact an inorganic layer. For example, a valley hole VH penetrating an organic insulating layer provided below the power supply electrode layer 72, i.e., the first and second organic insulating layers 111 and 113, may be formed and a part of the power supply electrode layer 72 may contact an inorganic insulating layer.

Since the first and second organic insulating layers 111 and 113 may be cut by the valley hole VH, a path of impurities proceeding through a bulk of the first and second organic insulating layers 111 and 113 may also be cut. For example, impurities generated during the manufacturing process of the display device or impurities penetrating after the manufacturing process may deteriorate pixels of the display area DA by proceeding towards the display area DA through the bulk of the first and second organic insulating layers 111 and 113. However, according to an exemplary embodiment, since the path of the impurities is cut by the valley hole VH, the OLED 200 of the pixel may be protected from the impurities.

A circuit forming the first scan driver 20 may be provided between the valley hole VH and a contact region of the power supply wiring 71 and the power supply electrode layer 72. The circuit forming the first scan driver 20 may be formed during forming processes of the driving TFT T1, the storage capacitor Cst, and various wirings connected thereto described above.

Since the inorganic insulating layer 110, the protection layer 109 protecting an inorganic material, and the first and second inorganic encapsulation layers 410 and 430 of the encapsulation layer 400 are stacked at the end portion of the substrate 100, impurities or moisture may be prevented from penetrating from the edge of the substrate 100.

According to one or more exemplary embodiments, a display device that prevents a pixel of a certain region of a display area from being damaged and has high emission efficiency and high lifespan may be provided.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
   a substrate including a top surface and a bottom surface opposite to the top surface;
   a thin-film transistor (TFT) on the top surface of the substrate and comprising a semiconductor layer and a gate electrode;
   an organic insulating layer covering the TFT;
   a display element comprising a pixel electrode electrically connected to the TFT, an opposite electrode, and an intermediate layer between the pixel electrode and the opposite electrode;
   a power supply wiring in a peripheral area outside a display area in which the display element is located, wherein the power supply wiring is electrically connected to the power supply electrode layer and comprises a material different from the power supply electrode layer;
   a power supply electrode layer electrically connected to the opposite electrode of the display element and comprising a plurality of holes over the organic insulating layer, wherein the plurality of holes are separated from each other, a first portion of the power supply electrode layer overlaps the power supply wiring, and a second portion of the power supply electrode layer overlaps the opposite electrode; and
   an encapsulation layer covering the display element,
   wherein the plurality of holes in the power supply electrode layer comprises:
   a first hole;
   a second hole adjacent to the first hole along a first direction parallel to the top surface of the substrate; and
   a third hole spaced apart from the first and second holes along a second direction parallel to the top surface of the substrate and crossing the first direction.

2. The display device of claim 1, wherein the first hole, the second hole, and the third hole are positioned at vertices of a virtual acute triangle when viewed in a third direction orthogonal to the top surface of the substrate.

3. The display device of claim 1, wherein the first hole, the second hole, and the third hole are covered the encapsulation layer.

4. The display device of claim 3, wherein:
   the encapsulation layer comprises:
   a first inorganic encapsulation layer;
   an organic encapsulation layer on the first inorganic encapsulation layer; and
   a second inorganic encapsulation layer; and
   the first hole, the second hole, and the third hole are overlapped by a portion of the first inorganic encapsulation layer, a portion of the organic encapsulation layer, and a portion of the second inorganic encapsulation layer.

5. The display device of claim 1, further comprising a plurality of protrusions spaced apart from each other and respectively covering at least some of the plurality of holes.

6. The display device of claim 5, wherein the plurality of protrusions comprise an organic insulating material.

7. The display device of claim 1, wherein the power supply electrode layer comprises a same material as that of the pixel electrode of the display element.

8. The display device of claim 1,
wherein the power supply wiring is electrically connected to the power supply electrode layer and comprises a material different from the power supply electrode layer.

9. The display device of claim 8, further comprising a dam in the peripheral area, the dam overlapping a portion of the power supply wiring.

10. The display device of claim 1, wherein the opposite electrode of the display element contacts a portion of the power supply electrode layer, and a contact region between the opposite electrode and the portion of the power supply electrode layer is located between adjacent holes of the plurality of holes of the power supply electrode layer.

11. A display device, comprising:
a thin-film transistor (TFT) comprising a semiconductor layer and a gate electrode;
an organic insulating layer covering the TFT;
a display element electrically connected to the TFT and comprising a pixel electrode disposed on the organic insulating layer, an opposite electrode on the pixel electrode, and an intermediate layer between the pixel electrode and the opposite electrode;
a power supply wiring in a peripheral area outside a display area in which the display element is located, wherein the power supply wiring is electrically connected to the power supply electrode layer and comprises a material different from the power supply electrode layer;
a power supply electrode layer disposed on the organic insulating layer, electrically connected to the opposite electrode, and comprising a plurality of holes therein; and
an encapsulation layer covering the display element, wherein:
the plurality of holes in the power supply electrode layer comprises:
a first hole and a second hole spaced apart from each other along a first direction on the organic insulating layer; and
a third hole spaced apart from the first and second holes, wherein the third hole is on an imaginary line extending along a second direction from an imaginary point between the first and second holes, the second direction being perpendicular to the first direction; and
the first, second, and third holes are positioned at vertices of a virtual acute triangle when viewed in a third direction orthogonal to the first and second directions.

12. The display device of claim 11, wherein the first hole, the second hole, and the third hole are covered by the encapsulation layer.

13. The display device of claim 12, wherein:
the encapsulation layer comprises:
a first inorganic encapsulation layer;
an organic encapsulation layer on the first inorganic encapsulation layer; and
a second inorganic encapsulation layer; and
the first hole, the second hole, and the third hole are overlapped by a portion of the first inorganic encapsulation layer, a portion of the organic encapsulation layer, and a portion of the second inorganic encapsulation layer.

14. The display device of claim 11, further comprising a plurality of protrusions spaced apart from each other and respectively covering at least some of the plurality of holes.

15. The display device of claim 14, wherein the plurality of protrusions comprise an organic insulating material.

16. The display device of claim 11, wherein the power supply electrode layer comprises a same material as that of the pixel electrode of the display element.

17. The display device of claim 11, further comprising a dam in the peripheral area, the dam overlapping a portion of the power supply wiring.

18. The display device of claim 11, wherein the opposite electrode of the display element contacts a portion of the power supply electrode layer, and a contact region between the opposite electrode and the portion of the power supply electrode layer is located between adjacent holes of the plurality of holes of the power supply electrode layer.

19. The display device of claim 18, wherein the contact region between the opposite electrode and the portion of the power supply electrode layer surrounds at least one of the first hole, the second, or the third hole when viewed in a third direction orthogonal to the first and second directions.

* * * * *